United States Patent
Raghuram et al.

(10) Patent No.: US 8,298,931 B2
(45) Date of Patent: Oct. 30, 2012

(54) DUAL DAMASCENE WITH AMORPHOUS CARBON FOR 3D DEEP VIA/TRENCH APPLICATION

(75) Inventors: Usha Raghuram, San Jose, CA (US); Michael W. Konevecki, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 902 days.

(21) Appl. No.: 11/864,759

(22) Filed: Sep. 28, 2007

(65) Prior Publication Data

US 2009/0087979 A1    Apr. 2, 2009

(51) Int. Cl.
H01L 21/4763    (2006.01)

(52) U.S. Cl. ........... 438/620; 257/E21.614; 438/671; 438/672

(58) Field of Classification Search .......... 438/671, 438/672, 620; 257/E21.614; H01L 21/4763
See application file for complete search history.

(56) References Cited

U.S. PATENT DOCUMENTS

| | | | |
|---|---|---|---|
| 5,915,167 A | 6/1999 | Leedy | |
| 6,218,079 B1* | 4/2001 | Shin et al. | 430/314 |
| 6,548,396 B2 | 4/2003 | Naik et al. | |
| 6,602,502 B1 | 8/2003 | Strahilevitz | |
| 6,704,235 B2 | 3/2004 | Knall et al. | |
| 6,787,452 B2 | 9/2004 | Sudijono et al. | |
| 6,919,168 B2 | 7/2005 | Hwang et al. | |
| 6,927,178 B2 | 8/2005 | Kim et al. | |
| 6,936,539 B2 | 8/2005 | Yin et al. | |
| 6,952,030 B2 | 10/2005 | Herner et al. | |
| 7,005,350 B2 | 2/2006 | Walker et al. | |
| 7,033,960 B1 | 4/2006 | You et al. | |
| 7,115,993 B2* | 10/2006 | Wetzel et al. | 257/758 |
| 7,129,180 B2 | 10/2006 | Sandhu et al. | |
| 7,407,893 B2* | 8/2008 | Seamons et al. | 438/778 |
| 7,432,210 B2* | 10/2008 | Wang et al. | 438/710 |
| 2003/0087484 A1 | 5/2003 | Vyvoda et al. | |
| 2003/0107311 A1 | 6/2003 | Radigan et al. | |
| 2004/0071034 A1* | 4/2004 | Vyvoda et al. | 365/222 |
| 2004/0190360 A1 | 9/2004 | Scheuerlein | |

(Continued)

OTHER PUBLICATIONS

V. Dunton et al., "Zias" Vertical wires in 3-d memory devices, VMIC Conference, 2005 IMIC, Oct. 4, 2005.
U.S. Appl. No. 11/769,027, titled "Method for Fabricating a 3-D Integrated Circuit Using a Hard Mask of Silicon-Oxynitride on Amorphous Carbon", filed Jun. 27, 2007.

(Continued)

Primary Examiner — Eugene Lee
Assistant Examiner — Peniel M Gumedzoe
(74) Attorney, Agent, or Firm — Vierra Magen Marcus & DeNiro LLP

(57) ABSTRACT

A method for fabricating a 3-D monolithic memory device in which a via and trench are etched using an amorphous carbon hard mask. The via extends in multiple levels of the device as a multi-level vertical interconnect. The trench extends laterally, such as to provide a word line or bit line for memory cells, or to provide other routing paths. A dual damascene process can be used in which the via is formed first and the trench is formed second, or the trench is formed first and the via is formed second. The technique is particularly suitable for deep via applications, such as for via depths of greater than 1 µm. A dielectric antireflective coating, optionally with a bottom antireflective coating, can be used to etch an amorphous carbon layer to provide the amorphous carbon hard mask.

22 Claims, 9 Drawing Sheets

U.S. PATENT DOCUMENTS

| | | | |
|---|---|---|---|
| 2004/0206996 A1* | 10/2004 | Lee et al. | 257/296 |
| 2004/0266206 A1 | 12/2004 | Cleeves | |
| 2005/0098800 A1 | 5/2005 | Herner et al. | |
| 2005/0214694 A1 | 9/2005 | Hong et al. | |
| 2006/0128153 A1 | 6/2006 | Dunton et al. | |
| 2006/0205207 A1 | 9/2006 | Chen et al. | |
| 2006/0222962 A1 | 10/2006 | Chen et al. | |

OTHER PUBLICATIONS

M. Vogt et al., Introduction of PECVD Carbon Hardmasks APF(TM) for sub-90nm DRAM Technology, ECS, 2004.

Excerpt from S. Wolf, "Silicon Processing for the VLS Era," vol. 4, p. 674-679, section 15.4, Introduction to Dual-Damascene Interconnect Processes, Lattice Press, 2004.

* cited by examiner

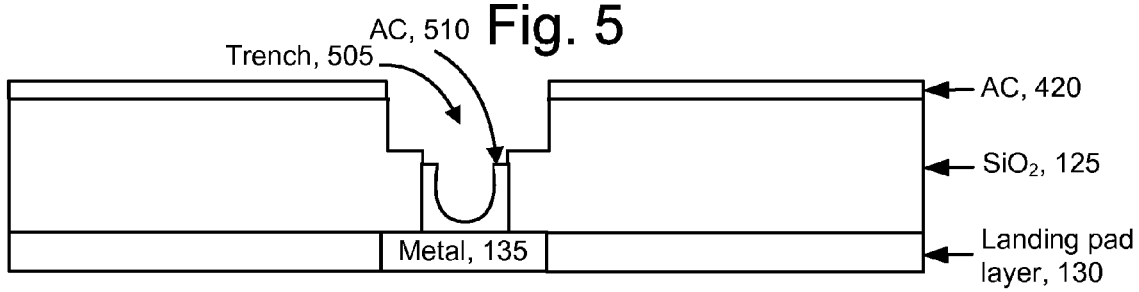
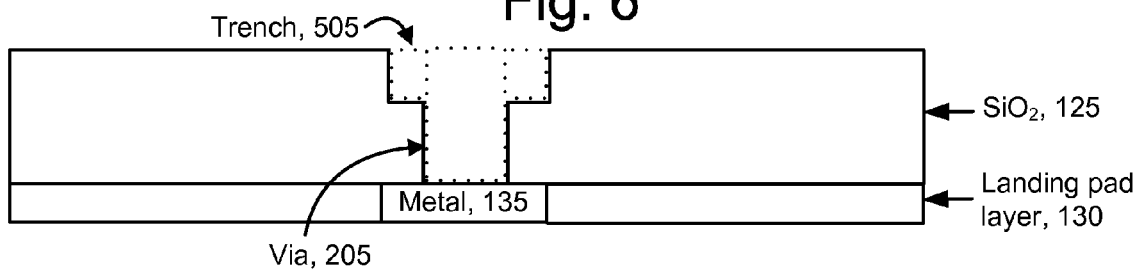
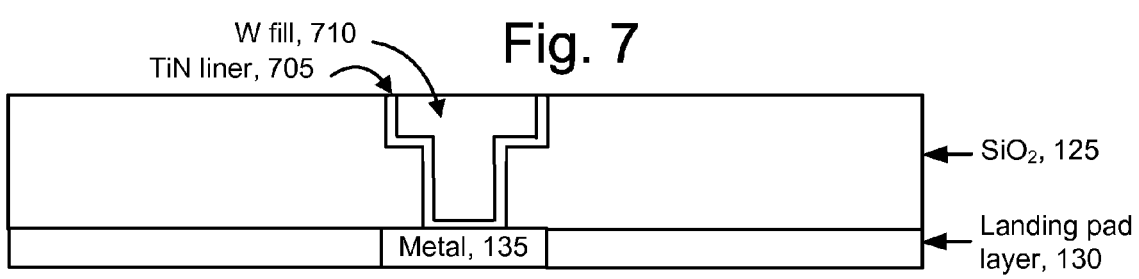
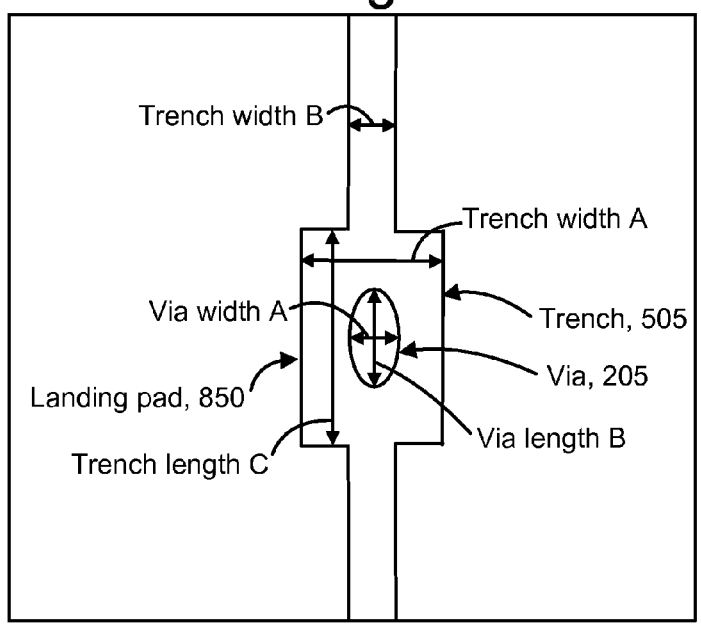

DUAL DAMASCENE WITH AMORPHOUS CARBON FOR 3D DEEP VIA/TRENCH APPLICATION

BACKGROUND OF THE INVENTION

1. Field of the Invention

The present invention relates to fabricating a 3-D integrated circuit.

2. Description of the Related Art

Due to the high cost of silicon real estate and the need to create ever smaller memory devices, monolithic 3-D memory devices have become increasingly popular. Such devices can include multiple levels of interconnected memory cells. Examples of this technology can be found in U.S. 2005/0098800, titled "Nonvolatile memory cell comprising a reduced height vertical diode," published May 12, 2005, and U.S. Pat. No. 6,952,030, titled "High-density three-dimensional memory cell", issued Oct. 4, 2005, both of which are incorporated herein by reference. In such devices, the memory cells can be formed as diodes in polysilicon layers, while conductive rails which interconnect the memory cells can be formed by etching oxide layers and depositing a conductive material. However, various challenges are encountered in forming interconnects between the layers of such memory devices and other 3-D integrated circuits. In particular, as 3-D monolithic integrated circuits push minimum feature sizes and etch and fill aspect ratios to the limit, conventional fabrication techniques have been found to be inadequate. For example, etching of relatively deep vias and trenches between layers can be problematic.

SUMMARY OF THE INVENTION

The present invention addresses the above and other issues by providing a method for fabricating a 3-D monolithic memory device in which etching of vias and trenches is improved.

In one embodiment, a method for fabricating a 3-D monolithic memory device includes first patterning of a first insulating layer to form a trench therein using a first amorphous carbon hard mask, applying amorphous carbon to fill in at least a portion of the trench and to provide an amorphous carbon layer above the first insulating layer, second patterning of the first insulating layer, using a second amorphous carbon hard mask formed from the amorphous carbon layer, to form a via in the first insulating layer which is aligned with the trench and extends below the trench, and providing a conductive material in the trench and via.

In another embodiment, a method for fabricating a 3-D monolithic memory device includes first patterning of a first insulating layer to form a via therein using a first amorphous carbon hard mask, applying amorphous carbon to fill in at least a portion of the via and to provide an amorphous carbon layer above the first insulating layer, second patterning of the first insulating layer, using at least the amorphous carbon layer as a second amorphous carbon hard mask, to form a trench in the first insulating layer aligned with the via, the via extends below the trench, and providing a conductive material in the trench and via.

In another embodiment, a method for fabricating a 3-D monolithic memory device includes forming conductive interconnects in the memory device, including at least a first interconnect in a first level and a second interconnect in a second level, the first and second interconnects each include an associated via and trench which are formed by a dual damascene process in which at least one of the via and trench is patterned using an associated amorphous carbon hard mask, a conductive material is provided in the via and trench, and the conductive material in the via and trench of the first interconnect is electrically coupled to the conductive material in the via and trench of the second interconnect.

BRIEF DESCRIPTION OF THE DRAWINGS

FIGS. 1-7 depict a via first, trench second fabrication process.

FIG. 1 depicts a layered structure for forming a 3-D integrated circuit.

FIG. 2 depicts the layered structure of FIG. 2 after patterning a via in an oxide layer.

FIG. 3 depicts the layered structure of FIG. 2 after stripping and cleaning an AC layer.

FIG. 4 depicts the layered structure of FIG. 3 after providing AC, DARC, BARC and PR layers.

FIG. 5 depicts the layered structure of FIG. 4 after patterning a trench in the oxide layer.

FIG. 6 depicts the layered structure of FIG. 5 after stripping and cleaning the AC.

FIG. 7 depicts the layered structure of FIG. 6 after applying a liner and conductive filler.

FIG. 8 depicts a top view of the layered structure of FIG. 7.

FIG. 10 depicts a layered structure for forming a 3-D integrated circuit.

FIG. 11 depicts the layered structure of FIG. 10 after patterning a trench in an oxide layer.

FIG. 12 depicts the layered structure of FIG. 11 after stripping and cleaning the AC layer.

FIG. 13 depicts the layered structure of FIG. 12 after providing AC, DARC, BARC and PR layers.

FIG. 14 depicts the layered structure of FIG. 13 after patterning a via in the oxide layer.

FIG. 15 depicts the layered structure of FIG. 14 after stripping and cleaning the AC.

FIG. 16 depicts the layered structure of FIG. 15 after applying a liner and conductive filler.

DETAILED DESCRIPTION

Figure 1:
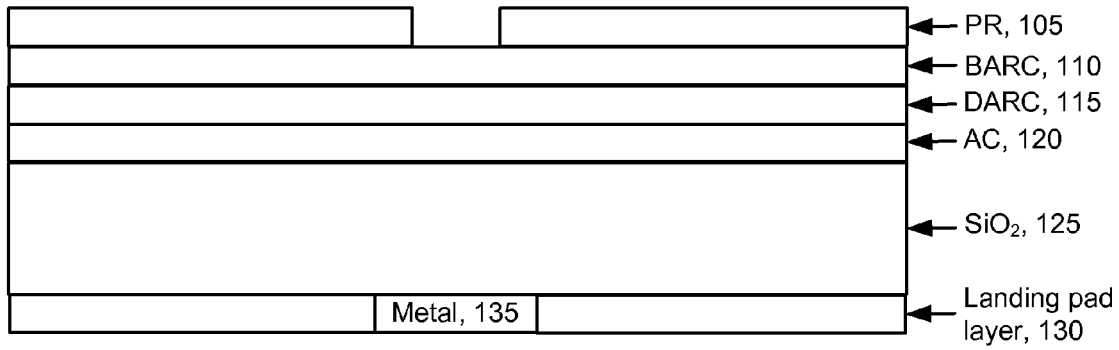

The present invention provides a method for fabricating a 3-D monolithic memory device in which etching of vias and trenches is improved. A corresponding apparatus is also provided.

The following acronyms and abbreviations are used:
AC—amorphous carbon;
BARC—bottom antireflective coating, available from Brewer Science, Rolla, Mo.
DARC—dielectric antireflective coating; and
PR—photoresist.

As mentioned at the outset, etching of relatively deep vias and trenches between layers in a 3-D monolithic memory device can be problematic. A monolithic three dimensional memory array or device is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in U.S. Pat. No. 5,915,167 to Leedy, titled "Three dimensional structure memory," incorporated herein by reference. The substrates may be thinned or removed from the memory levels before bonding, but as the memory levels are initially formed over separate substrates, such memories are not true monolithic three dimensional memory arrays. A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

For short vias and trenches, e.g., less than about 0.5 μm, the etching can use a dual damascene process in which a BARC layer is used for patterning a second layer while protecting a first, patterned layer. In a damascene process, features are formed by forming voids in a dielectric, then filling those voids with conductive or semiconductor material. A dual damascene process involves forming and filling two overlapping voids. However, approaches which are suitable for short vias may not be sufficient in applications where deep vias are used. Such applications include 3-D applications, where a via, also referred to as a zia, contacts multiple levels of a 3-D device simultaneously. See, for example, V. Dunton et al., "Zias: Vertical wires in 3-D memory devices," Matrix Semiconductor, 2005 VMIC Conference, Oct. 4-6, 2005, incorporated herein by reference. The via can be etched through multiple levels of the device in a single pass through an etcher and may have a depth of, e.g., 1.5-2.0 μm. A technique is provided herein for a dual damascene application for a 3-D zia/trench combination using an amorphous carbon hard mask.

FIGS. 1-7 depict a via first, trench second fabrication process. An overview of example process steps is as follows: trench and via oxide deposition, via/zia patterning (photolithography and etch) and cleans, amorphous carbon and DARC/BARC deposition for trench patterning, trench photolithography, and trench etch and clean. Further details are provided below.

FIG. 1 depicts a layered structure for forming a 3-D integrated circuit. The layered structure may be formed on a substrate, which can be any semiconducting substrate as known in the art, such as monocrystalline silicon, IV-IV compounds such as silicon-germanium or silicon-germanium-carbon, III-V compounds, II-VII compounds, epitaxial layers over such substrates, or any other semiconducting material. The substrate may include integrated circuits fabricated therein.

The layered structure includes a landing pad layer 130, which includes a metal landing pad 135 or other conductive connection point in the circuit. Insulating material may be provided around the metal landing pad 135 in the landing pad layer 130. An insulating layer 125, such as $SiO_2$ or other oxide, is deposited above the landing pad layer 130. Alternatively, or additionally, the insulating layer 125 can include a high-dielectric film, Si—C—O—H film, or any other suitable insulating material. An amorphous carbon (AC) layer 120 is deposited on the insulating layer 125 and may therefore contact a top surface of the insulating layer 125. The amorphous carbon can be obtained as the product "Advanced Patterning Film (APF)®", which is available from Applied Materials Inc., Santa Clara, Calif. A DARC layer 115 is deposited on the AC layer 120. The DARC layer 115 may include silicon-oxynitride, for instance. DARC is a deposited film produced in a PECVD reactor. Optionally, a BARC layer 110 can be used on top of the DARC layer 115, but does not replace the properties of the DARC layer 115 in masking the amorphous carbon film stack below. A PR layer 105 is deposited on the BARC layer 110, when present, or on the DARC layer 115 when a BARC layer is not present. In one possible implementation, the PR layer is of a type which is exposed by 193 nm (deep ultraviolet) light. The photoresist is shown after being patterned. In one possible approach, a pattern of an attenuated phase shift photomask is transferred to the photoresist layer 105 by selectively exposing the photoresist layer to UV light and removing the exposed portion of the photoresist using a developer.

Etching of the layered structure involves three different etch chemistries, namely one for etching the BARC and DARC layer, one for etching the AC layer and one for etching the oxide. In the first etch, the BARC and DARC layers are etched using the PR layer as a mask. In the second etch, the AC layer is etched mainly using the DARC layer as a hard mask. In the third etch, the oxide layer is etched essentially using the AC layer as a hard mask. Although different etch chemistries are used, the etch can be a single, continuous process in which a wafer with photo patterning is placed into an etcher and all the films are etched in a single pass. When the wafer is first placed in the etcher, the stacks appear as in FIG. 1. When the wafer is removed from the etcher, the stacks appear as in FIG. 2. Note that the figures are not to scale. Additionally, in some cases, the step for going from the configuration of FIG. 3 to that of FIG. 4, described further below, is also integrated into the same etch process. In the etch chamber, the BARC, DARC, AC and oxide etches and, in some cases, plasma strip of AC, occur sequentially. For example, at the end of DARC etch, there may be some PR and BARC or BARC but no PR, on the wafer. Typically, the PR/BARC is used up sometime during the AC etch.

Further, the required thickness of each layer depends on the thickness of the underlying layer or layers which are being etched, and the requirements of the process architecture. For the via etch, in an example implementation, the PR layer is about 1,000-5,000 Å thick, the BARC layer is about 200-2,000 Å thick, and the DARC layer is about 200-800 Å thick. The AC layer may be about 4,000-8,000 Å thick to etch a 1-2 μm deep via in the oxide layer. Generally, amorphous carbon can provide an effective, easily etched, and easily removable hard mask with high selectivity to silicon, oxide, and tungsten.

Note that the layered structure of FIG. 1 may already have other components fabricated therein, such as memory cells, word lines and bit lines, when the via and trench are formed.

Figure 2:
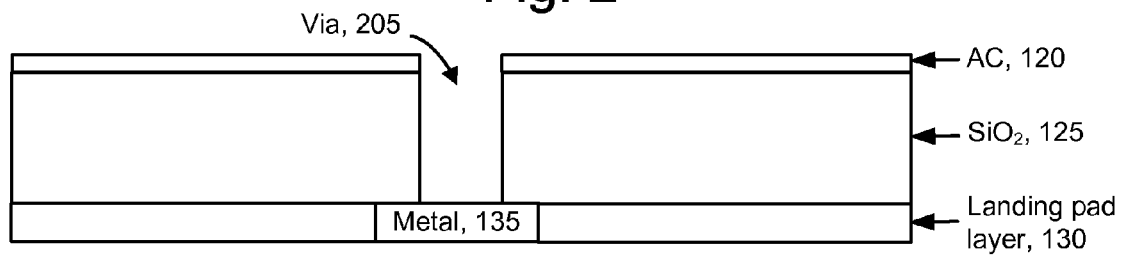

FIG. 2 depicts the layered structure of FIG. 1 after patterning a via 205 in an oxide layer 125 using etching as described above. The via generally extends down to the metal landing pad 135 for subsequently forming a conductive connection to the metal landing pad. In an example implementation, the via can have a depth which is greater than about 0.5-1 μm or about 1-2 μm or more, for instance. The via may be about 0.065 μm wide for a device in which a minimum feature size is 45 nm in the example implementation. Other implementations are possible as well.

Figure 3:
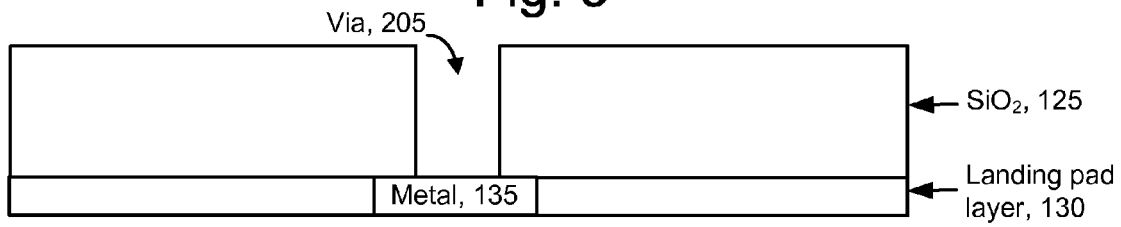

FIG. 3 depicts the layered structure of FIG. 2 after stripping and cleaning the AC layer. For example, a plasma strip may be used. Having formed the via 205, the process continues to form a trench, as discussed next.

Figure 4:
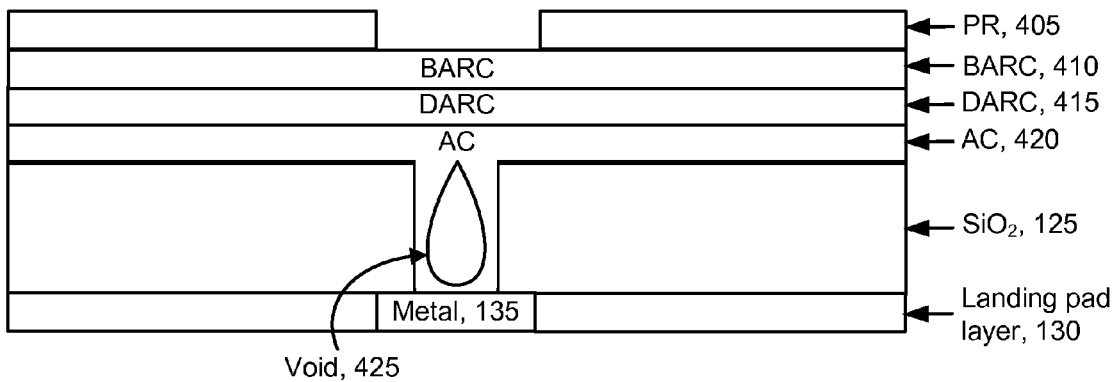

FIG. 4 depicts the layered structure of FIG. 3 after applying AC, DARC, BARC and PR layers. First, amorphous carbon is deposited to fill in the via. Due to the narrowness and depth of the via, the amorphous carbon may not uniformly fill the via, in which case a void 425 may be formed. However, the void is not problematic as long as there is sufficient AC in the via to protect the via in the subsequent trench etch. The deposited amorphous carbon also forms a layer 420 above the oxide 125. Subsequently, a DARC layer 415 is deposited on the AC layer 420, a BARC layer 410 is optionally deposited on the DARC layer 415, and a PR layer 405 is deposited on the BARC layer 410, if present, or on the DARC layer 415 if the BARC layer is not present. The PR layer 405 may subsequently be patterned to form an opening which is transferred by etching to form a trench in the oxide. For the trench etch, in an example implementation, the PR layer is about 1,000-2,000 Å thick, the BARC layer is about 200-1,000 Å thick, and the DARC layer is about 200-600 Å thick. The AC layer may be about 1,500-3,000 Å thick to etch a 2,000-5,000 Å deep trench in the oxide layer.

FIG. 5 depicts the layered structure of FIG. 4 after patterning a trench 505 in the oxide layer 125 when the oxide layer is etched using the AC layer 420 as a hard mask. The remaining portion of the AC 510 which at least partly filled in the via is also depicted. Generally, the trench will be wider than the via, although this is not required. The trench extends laterally in a level of a 3-D device, such as to form word lines, bit lines, or other routing lines in the level. The trench may have a width of about 120 nm in a landing pad region, and a width of about 45 nm outside the landing pad. See also FIG. 8.

FIG. 6 depicts the layered structure of FIG. 5 after stripping and cleaning the AC. As mentioned previously, a plasma strip may be used. At this point, both the via 205 and trench 505 have been formed. The via extends generally from the bottom of the oxide layer 125, at the top of the metal landing pad 135, to a top of the oxide layer 125. When subsequent levels are formed in a 3-D device, the vias in each layer will contact one another to form a continuous via or zia in multiple levels. See also FIGS. 18 and 19.

FIG. 7 depicts the layered structure of FIG. 6 after applying a liner and conductive filler. A titanium nitride (TiN) liner 705 may be used as a glue layer for the conductive material 710 which is subsequently deposited. For example, the conductive material can be tungsten (W). Generally, any suitable conductor that can fill in the trench and via, and withstand high processing temperatures, such as 750 C, can be used. In another possible approach, a copper (Cu) barrier is used when the oxide is a low k material.

FIG. 8 depicts a top view of the layered structure of FIG. 7. The trench 505 and via 205 are depicted in a landing pad area 850 of the device. Here, the trench is widened to allow room for the via. In an example implementation, in the landing pad area 850, the trench has a width A, e.g., 120 nm, and a length C, e.g., 200 nm. The via has a width A, e.g., 65 nm, and a length B, e.g., 80 nm. The via has an elongated cross section in this example. In other approaches, the via cross section can be circular. Outside the landing pad area 850, the trench has a narrow width, e.g., 45 nm, which is the smallest dimension in the device, in this example. The dimensions and configuration provided are examples only as many other dimensions and configurations can be used. An example sequence for carrying out the above-described process is summarized below.

Figure 9:
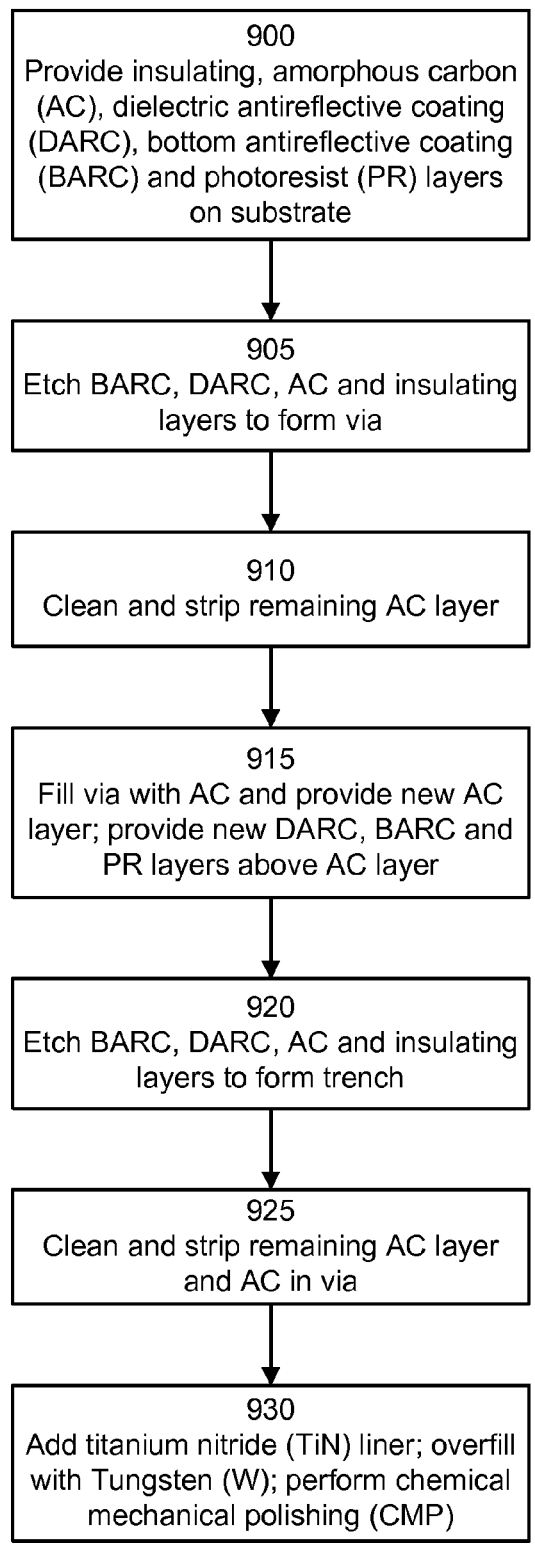
FIG. 9 depicts a via first, trench second process for forming a 3-D integrated circuit.

FIG. 9 depicts a via first, trench second process for forming a 3-D integrated circuit. Note that, in this and other flowcharts, the steps shown do not necessarily occur as discrete steps. Step 900 includes providing insulating, AC, DARC, BARC and PR layers on a substrate (see FIG. 1). Step 905 includes etching the BARC, DARC, AC and insulating layers using appropriate etch chemistries, to form one or more vias. Note that the different chemistries can be set, one after another, while the substrate remains in an etch chamber, as mentioned, so that the etch occurs as a continuous process. Step 910 includes cleaning and stripping of the remaining AC layer (see FIG. 3). Step 915 includes filling the via with AC and providing a new AC layer above the insulating layer. The step further includes providing new DARC, BARC and PR layers above the new AC layer (see FIG. 4). Step 920 includes etching the BARC, DARC, AC and insulating layers using appropriate etch chemistries to form a trench (see FIG. 5). The trench is aligned with the via, and the via extends below the trench. Step 925 includes cleaning and stripping of the remaining AC layer and the AC in the via (see FIG. 6). Step 930 includes adding a titanium nitride liner, overfilling the trench and via with a conductive material such as tungsten, and performing chemical mechanical polishing to planarize the device (see FIG. 7).

As an alternative to the via first option discussed, a trench first process may be used, as discussed next. FIGS. 10-16 depict a trench first, via second fabrication process.

Figure 10:
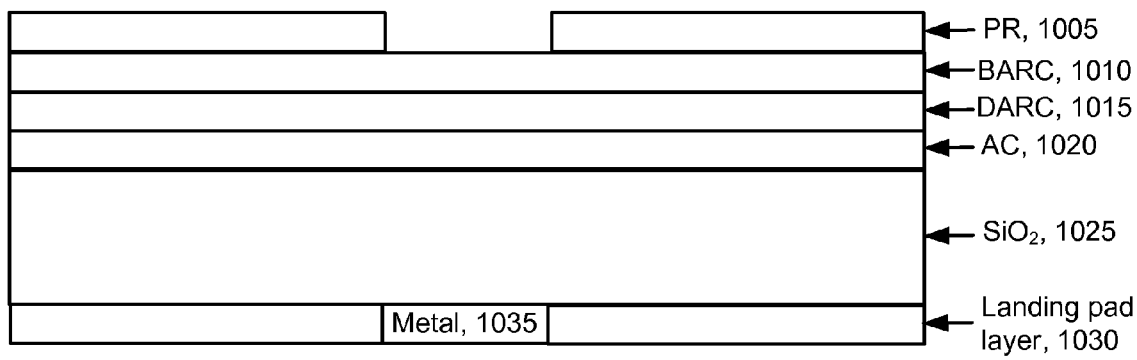
FIGS. 10-16 depict a trench first, via second fabrication process.

FIG. 10 depicts a layered structure for forming a 3-D integrated circuit. The structure is analogous to that provided in FIG. 1, and includes a landing pad layer 1030, which includes a metal landing pad 1035 or other conductive connection point in the circuit, an insulating layer 1025, such as $SiO_2$ or other oxide, an AC layer 1020, a DARC layer 1015, an optional BARC layer 1010, and a PR layer 1005.

As discussed, etching of the structure in FIG. 10 may occur using different etch chemistries, but in a single continuous process. When the wafer is first placed in the etcher, the stacks appear as in FIG. 10. When the wafer is removed from the etcher, the stacks appear as in FIG. 11. Again, note that the figures are not to scale. Additionally, in some cases, the step for going from the configuration of FIG. 11 to that of FIG. 12, discussed further below, is also integrated into the same etch process. For the trench etch, in an example implementation, the PR layer is about 1,000-2,000 Å thick, the BARC layer is about 200-1,000 Å thick, and the DARC layer is about 200-600 Å thick. The AC layer may be about 1,500-3,000 Å thick to etch a 2,000-5,000 Å deep trench in the oxide layer.

Figure 11:
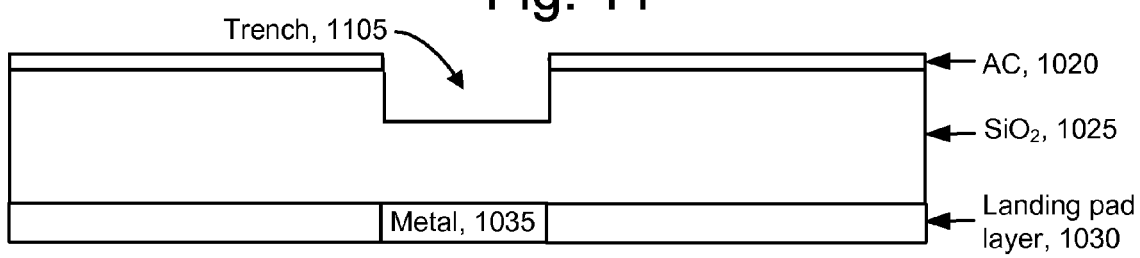

FIG. 11 depicts the layered structure of FIG. 10 after patterning a trench 1105 in an oxide layer 1025 using etching as described above. The trench generally is wider and shallower than a via.

Figure 12:
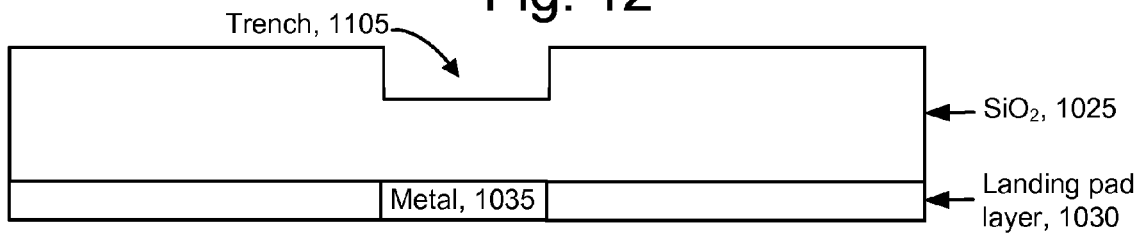

FIG. 12 depicts the layered structure of FIG. 11 after stripping and cleaning the AC layer. A plasma strip may be used. Having formed the trench 1105, the process continues to form a via, as discussed next.

Figure 13:
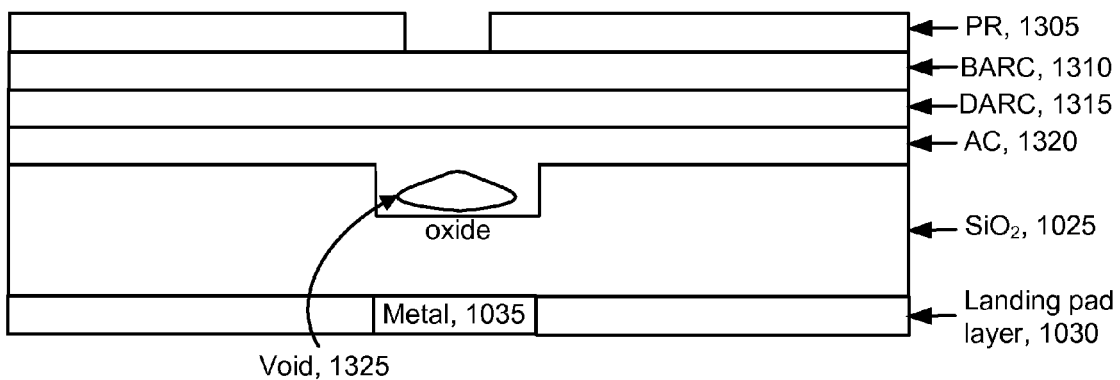

FIG. 13 depicts the layered structure of FIG. 12 after applying AC, DARC, BARC and PR layers. First, amorphous carbon is deposited to fill in the trench. Due to the narrowness of the trench, the amorphous carbon may not uniformly fill the trench, in which case a void 1325 may be formed. However, the void is not problematic as long as there is sufficient AC in the trench to protect the trench in the subsequent via etch. The deposited amorphous carbon also forms a layer 1320 above the oxide 1025. Subsequently, a DARC layer 1315 is deposited on the AC layer 1320, a BARC layer 1310 is optionally deposited on the DARC layer 1315, and a PR layer 1305 is deposited on the BARC layer 1310, if present, or on the DARC layer 1315 if the BARC layer is not present. The PR layer 1305 may subsequently be patterned to form an opening which is transferred by etching to form a via in the oxide. For the via etch, in an example implementation, the PR layer is about 1,000-5,000 Å thick, the BARC layer is about 200-2,000 Å thick, the DARC layer is about 200-800 Å thick. The AC layer may be about 4,000-8,000 Å thick to etch a 1-2 μm deep via in the oxide layer.

Figure 14:
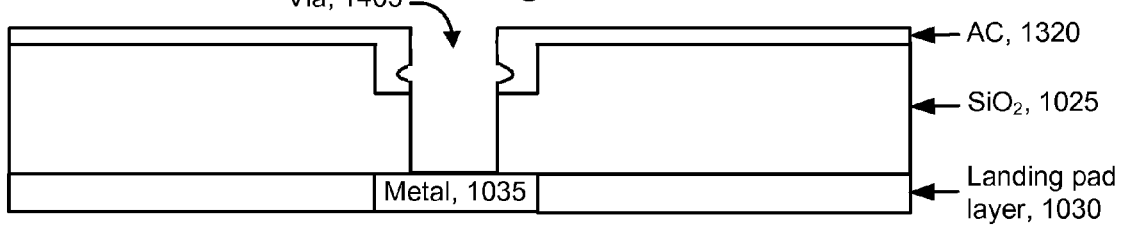

FIG. 14 depicts the layered structure of FIG. 13 after patterning a via 1405 in the oxide layer 1025 when the oxide layer is etched using the AC layer 1320 as a hard mask. The remaining portion of the AC 1310 which at least partly filled in the trench is also depicted.

Figure 15:
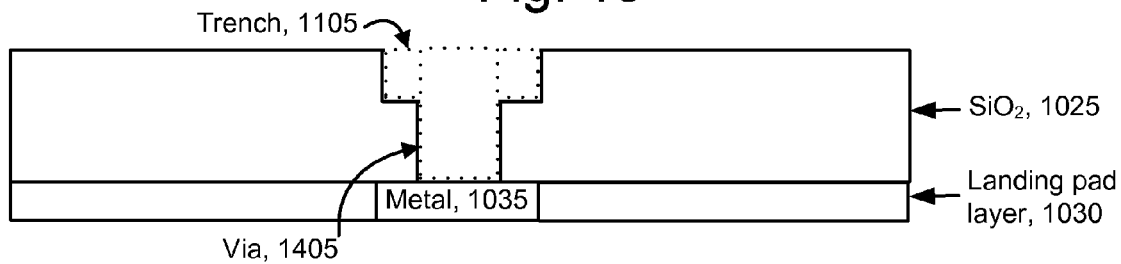

FIG. 15 depicts the layered structure of FIG. 14 after stripping and cleaning the AC. As mentioned previously, a plasma strip may be used. At this point, both the via 1405 and trench 1105 have been formed. The via extends generally from the bottom of the oxide layer 1025, at the top of the metal landing pad 1035, to a top of the oxide layer 125. When subsequent levels are formed in a 3-D device, the vias in each layer will contact one another to form a continuous via or zia in multiple levels. See also FIGS. 18 and 19.

Figure 16:
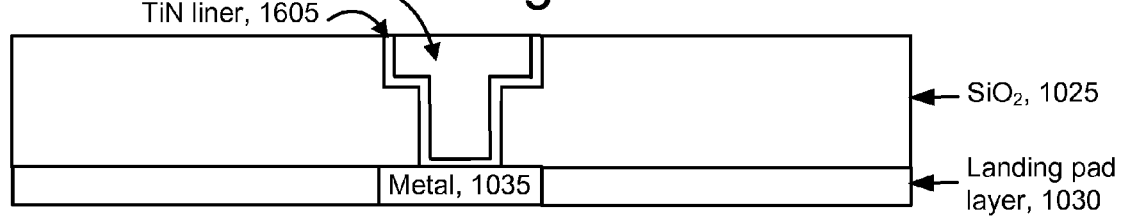

FIG. 16 depicts the layered structure of FIG. 15 after applying a liner and conductive filler. A titanium nitride (TiN) liner 1605 may be used as a glue layer for the conductive material 1610 which is subsequently deposited. For example, the conductive material can be tungsten (W). Generally, any suitable conductor that can fill in the trench and via, and withstand high processing temperatures, such as 750 C, can be used. In another possible approach, a copper (Cu) barrier is used when the oxide is a low k material.

Figure 17:
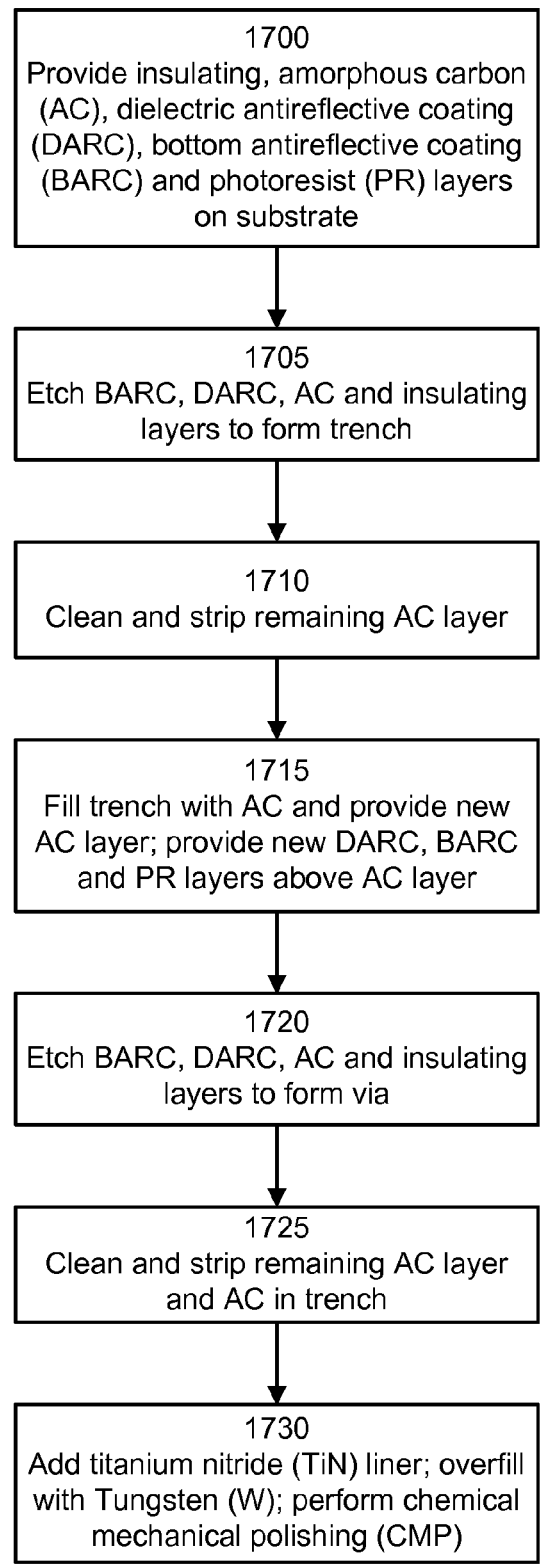
FIG. 17 depicts a trench first, via second process for forming a 3-D integrated circuit.

FIG. 17 depicts a trench first, via second process for forming a 3-D integrated circuit. Step 1700 includes providing insulating, AC, DARC, BARC and PR layers on a substrate (see FIG. 10). Step 1705 includes etching the BARC, DARC, AC and insulating layers using appropriate etch chemistries, to form on or more trenches. Note that the different chemistries can be set, one after another, while the substrate remains in an etch chamber, as mentioned, so that the etch occurs as a continuous process. Step 1710 includes cleaning and stripping of the remaining AC layer (see FIG. 12). Step 1715 includes filling the trench with AC and providing a new AC layer above the insulating layer. The step further includes providing new DARC, BARC and PR layers above the new AC layer (see FIG. 13). Step 1720 includes etching the BARC, DARC, AC and insulating layers using appropriate etch chemistries to form a via (see FIG. 14). Step 1725 includes cleaning and stripping of the remaining AC layer and the AC in the trench (see FIG. 15). Step 1730 includes adding a titanium nitride liner, overfilling the trench and via with a conductive material such as tungsten, and performing chemical mechanical polishing to planarize the device (see FIG. 16).

Figure 18:
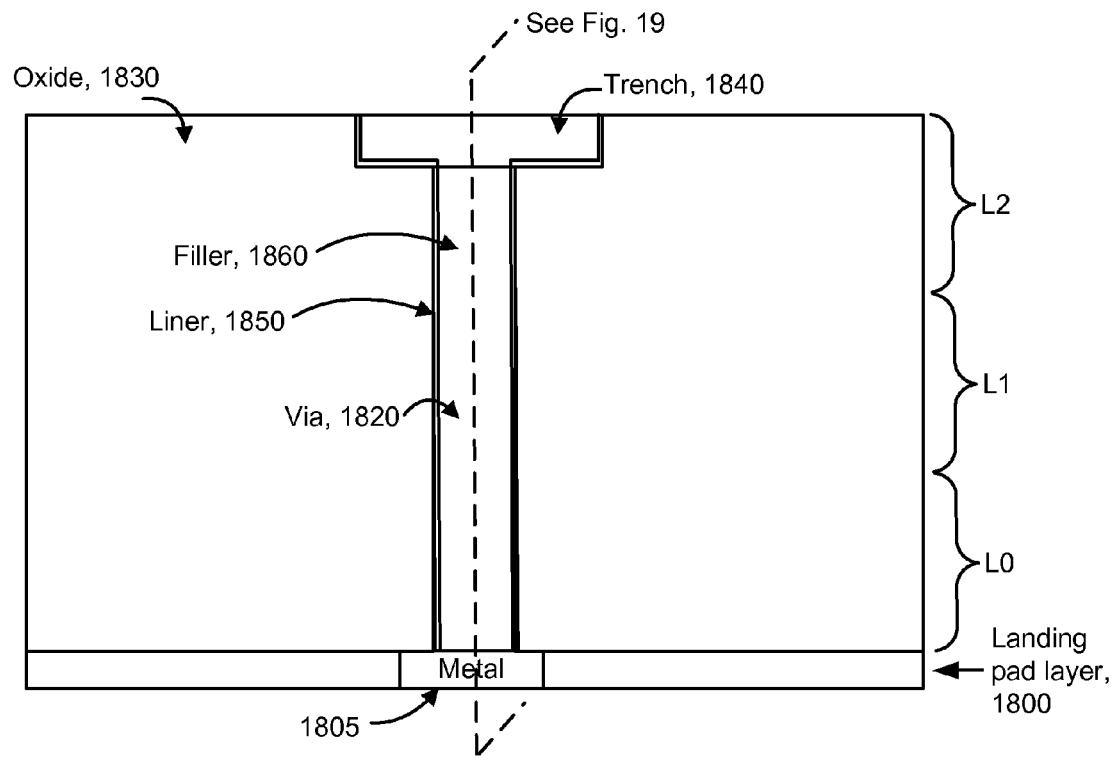
FIG. 18 depicts a multi-level 3-D integrated circuit structure showing a trench and via interconnect.

FIG. 18 depicts a multi-level 3-D integrated circuit structure showing a trench and via interconnect. As mentioned, the layered semiconductor structure with the trench and via formed therein, such as provided in FIGS. 7 and 16, can be formed to interconnect multiple levels in a 3-D device. After the levels are formed, the via and trench are formed, and conductive material is provided in the via/trench. The conductive material forms a continuous conductive path through the levels to provide a vertical conductive interconnect in the device.

An example multi-level device includes three levels, L0, L1 and L2. An example via 1820, at its bottom, connects to a respective metal pad 1805 in a landing pad layer 1800. The trench 1840 at the top of the via 1820 extends laterally in one of the levels of the device, L2, to provide a word line, bit line or other routing line. The oxide 1830, liner 1850 and conductive filler 1860, are also depicted. Appropriate control circuits of the multi-level device are used to provide voltages to the via and trench via the metal pad 1805.

Figure 19:
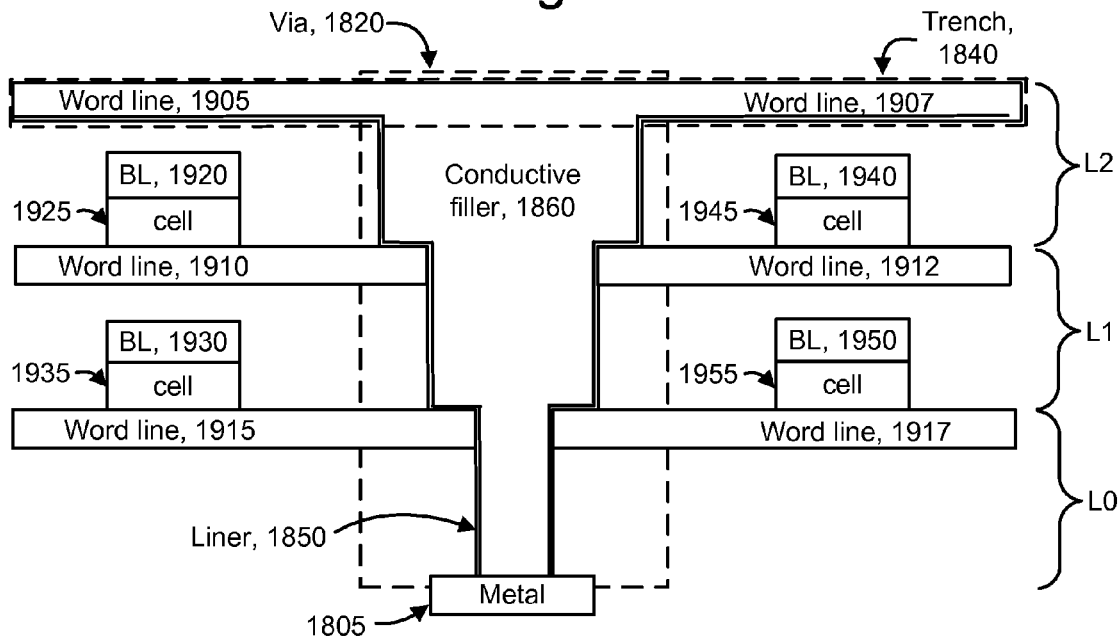
FIG. 19 depicts a cross-sectional view of the multi-level 3-D integrated circuit structure of FIG. 18.

FIG. 19 depicts a cross-sectional view of the multi-level 3-D integrated circuit structure of FIG. 18. The cross-section depicts the metal pad 1805, via 1820, trench 1840, liner 1850, conductive filler 1860 and levels L0, L1 and L2 of FIG. 18. In particular, it can be seen that the via 1820 has a width which increases step wise with each higher level. Further, the via contacts, or lands on, word lines at each level of the device, in this example. A via could similarly contact bit lines at different levels of a device. At the top of the via, the trench 1840 is used to provide word lines 1905 and 1907. The via, which includes the liner 1850 and conductive filler 1860, lands on word lines 1910 and 1912 in the L1 level of the device, and on word lines 1915 and 1917 in the L0 level of the device. In this mirror image configuration, the word lines extend on both sides of the via 1820. In other configurations, the word lines may extend from only one side of the via 1820. For a memory device, the word lines are conductive rails which contact bottom portions of memory cells, such as example cells 1925, 1935, 1945 and 1955. Further, bit lines (BLs) can be formed as conductive rails which communicate with top portions of the memory cells, such as example bit lines 1920, 1930, 1940 and 1950 which communicate with cells 1925, 1935, 1945 and 1955, respectively. Further details regarding operation of the memory cells are discussed next.

Figure 20:
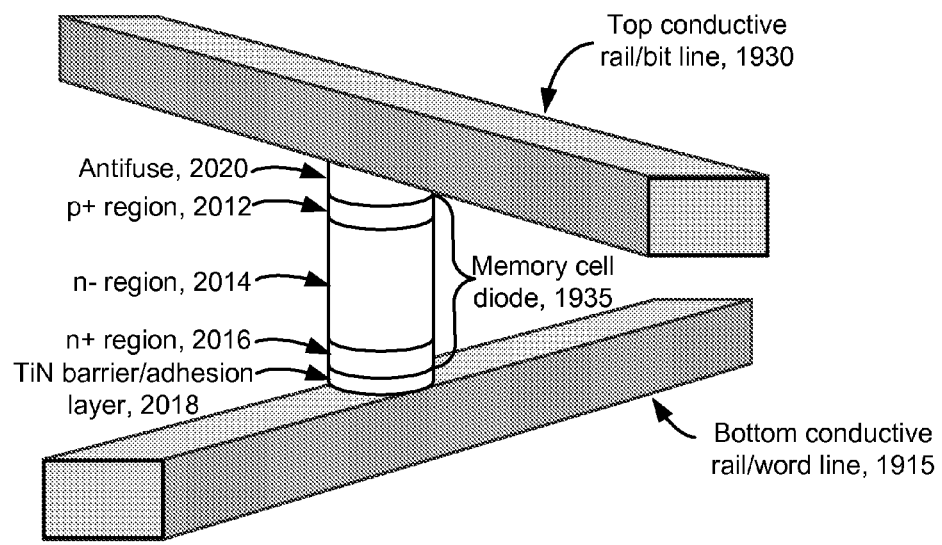
FIG. 20 depicts a memory cell in a 3-D memory device.

FIG. 20 depicts a memory cell in a 3-D memory device. U.S. Pat. No. 6,952,030, incorporated herein by reference, discloses an example configuration of the memory cell 1935. In this case, the memory cell includes a vertically oriented junction diode and a dielectric rupture antifuse interposed between top and bottom conductors. In particular, a vertically oriented junction diode 1935 includes a heavily doped semiconductor layer 2012 of a first conductivity type (e.g., p+ type), a layer 2014 which is undoped or lightly doped semiconductor material, and a heavily doped semiconductor layer 2016 of a second conductivity type (e.g., n+ type). The semiconductor material of diode 1935 can be, e.g., silicon, germanium, or an alloy of silicon and/or germanium. Diode 1935 and dielectric rupture antifuse 2020 are arranged in series between a bottom conductor/word line 1915 and a top conductor/bit line 1930, which may be formed of a metal such as tungsten. The conductors can be in the form of rails or other elongated members which extend parallel to one another in a given level and transverse to one another in alternating levels. A titanium nitride adhesion and barrier layer 2018 can also be provided between the diode 1935 and the bottom conductive rail 1915.

The diode 1935 can be a junction diode, which is a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

In one possible approach, the heavily doped n-type silicon layer 2016 is provided and doped in situ, followed by the layer 2014 of intrinsic or lightly doped silicon. Silicon regions 2016 and 2014 can be amorphous as deposited, and crystallized later to polycrystalline silicon, also referred to as polysilicon. Note that the p+ region 2012 can be formed after the silicon is patterned and etched into pillars. For instance, ion implantation of a p-type dopant, for example boron or $BF_2$, can be used to form a shallow junction. For simplicity, formation of a p-i-n diode having an n-region at the bottom and a p-region at the top, formed of silicon, has been described. In alternate embodiments, the polarity of the diode could be reversed, or the semiconductor may be germanium, a silicon-germanium alloy, or some other material.

In the initial state of the memory cell, the diode 1935 acts as an open circuit when a read voltage is applied between the top conductor 1930 and the bottom conductor 1915. The antifuse 2020 impedes current flow, and in most embodiments the polycrystalline semiconductor material of diode 1935 is formed in a relatively high-resistivity state. Application of a programming voltage between the top conductor 1930 and the bottom conductor 1915 causes dielectric breakdown of the antifuse material, permanently forming a conductive path through the antifuse 2020. The semiconductor material of diode 1935 is altered as well, changing it to a lower-resistivity state. After programming, a readily detectable current flows between the top conductor 1930 and the bottom conductor 1915 upon application of a read voltage. In this way a programmed cell can be distinguished from an unprogrammed cell. Further, the cell is binary. For example, a logical one value can be assigned when no current flows, and a logical zero value can be assigned when current flows. Various other memory cell configurations are possible.

Figure 21:
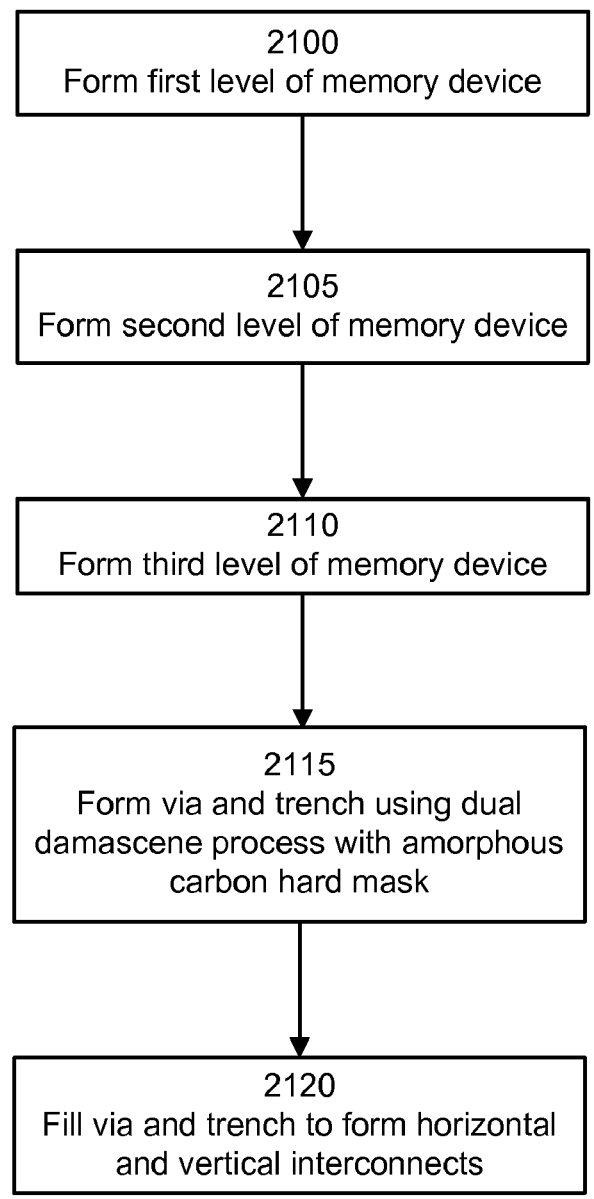
FIG. 21 depicts a process for forming a 3-D integrated circuit.

FIG. 21 depicts a process for forming a 3-D integrated circuit. In the example process, three levels are formed. However, the process can be adapted to form any number of levels. Steps 2100, 2105 and 2110 include forming first, second and third levels of the memory device, one after another. For each level, various steps for forming the memory cells, word lines and bit lines can be performed. Step 2115 includes forming an overlapping via and trench using a dual damascene process with amorphous carbon hard mask. Step 2120 includes filling the via and trench with conductive material.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a 3-D monolithic memory device, comprising:
   first patterning of a first insulating layer, forming a via therein, the first patterning using a first amorphous carbon hard mask, the via extends through at least two levels of the 3-D monolithic memory device, each of the at least two levels includes memory cells, and the via extends down to a landing pad and has a depth of more than 1.5 μm;
   applying amorphous carbon filling in at least a portion of the via and providing an amorphous carbon layer above the first insulating layer;
   second patterning of the first insulating layer, using at least the amorphous carbon layer as a second amorphous carbon hard mask, forming a trench in the first insulating layer aligned with the via, the via extends below the trench; and
   filling the trench and via with a conductive material.

2. The method of claim 1, further comprising:
   patterning the amorphous carbon layer using an anti-reflective coating as a hard mask, thereby obtaining the second amorphous carbon hard mask.

3. The method of claim 2, wherein:
   the amorphous carbon layer is in contact with a top surface of the first insulating layer, and the anti-reflective coating is in contact with a top surface of the amorphous carbon layer.

4. The method of claim 1, wherein:
   the providing of the second amorphous carbon hard mask includes: applying a dielectric anti-reflective coating above the amorphous carbon layer, applying a bottom anti-reflective coating above the dielectric anti-reflective coating, and patterning the amorphous carbon layer using the dielectric anti-reflective coating and the bottom anti-reflective coating as hard masks.

5. The method of claim 1, wherein:
   the trench extends laterally in a level of the memory device.

6. The method of claim 1, wherein:
   the amorphous carbon layer is in contact with a top surface of the first insulating layer.

7. The method of claim 1, further comprising:
   removing the first amorphous carbon hard mask prior to the applying amorphous carbon.

8. The method of claim 1, wherein:
   the depth of the via is greater than 2 μm.

9. A method for fabricating a 3-D monolithic memory device, comprising:
   forming a vertical conductive interconnect which extends in multiple levels in the 3-D monolithic memory device, the vertical conductive interconnect comprises a via and trench which are formed by a dual damascene process in which the via and trench are patterned using an associated amorphous carbon hard mask, and a conductive material is provided in the via and trench, the via extending through at least two levels of the 3-D monolithic memory device, each of the at least two levels includes memory cells, and the via extends down to a landing pad and has a depth of more than 1.5 μm, wherein the dual damascene process comprises:
   first patterning an insulating layer using the associated amorphous carbon hard mask, forming the via or trench;
   applying amorphous carbon filling in at least a portion of the via and providing an amorphous carbon layer above the insulating layer; and
   second patterning of the insulating layer, using at least the amorphous carbon layer as an additional amorphous carbon hard mask, forming the trench or via in the insulating layer, the via extends below the trench, the second patterning forms the trench when the first patterning forms the via, and the second patterning forms the via when the first patterning forms the trench.

10. The method of claim 9, wherein the dual damascene process comprises:
    removing the associated amorphous carbon hard mask after the first patterning and prior to the applying amorphous carbon.

11. The method of claim 9, wherein the dual damascene process comprises:
    patterning the amorphous carbon layer using an anti-reflective coating as a hard mask, obtaining the additional amorphous carbon hard mask.

12. The method of claim 11, wherein:
    the amorphous carbon layer is in contact with a top surface of the insulating layer, and the anti-reflective coating is in contact with a top surface of the amorphous carbon layer.

13. The method of claim 1, wherein:
the via has a width which increases step wise with each higher level of the 3-D monolithic memory device.

14. The method of claim 1, wherein:
the via lands on word lines or bit lines at the each of the at least two levels.

15. The method of claim 1, wherein:
at a top of the via, the trench provides word lines or bit lines.

16. The method of claim 1, wherein:
each memory cell comprises a vertically oriented junction diode and a dielectric rupture antifuse between top and bottom conductors.

17. The method of claim 11, wherein:
the depth of the via is at least 2.0 μm.

18. The method of claim 11, wherein:
the via has a width which increases step wise with each higher level of the 3-D monolithic memory device.

19. The method of claim 11, wherein:
the via lands on word lines or bit lines at the each of the at least two levels.

20. The method of claim 11, wherein:
at a top of the via, the trench provides word lines or bit lines.

21. The method of claim 11, wherein:
each memory cell comprises a vertically oriented junction diode and a dielectric rupture antifuse between top and bottom conductors.

22. The method of claim 1, further comprising:
overfilling the trench and via with the conductive material; and
subsequently performing chemical mechanical polishing to planarize the 3-D monolithic memory device.

* * * * *